(12) United States Patent
Leong (10) Patent No.: US 10,848,155 B2
(45) Date of Patent: Nov. 24, 2020

(54) FLEXIBLE TRANSMITTER CIRCUITRY FOR INTEGRATED CIRCUITS

(71) Applicant: Intel Corporation, Santa Clara, CA (US)

(72) Inventor: Chee Seng Leong, Malaysia (MY)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/277,674

(22) Filed: Feb. 15, 2019

(65) Prior Publication Data

US 2019/0181865 A1 Jun. 13, 2019

(51) Int. Cl.
*H03K 19/0185* (2006.01)
*H03K 3/037* (2006.01)
*H01L 23/00* (2006.01)
*H01L 25/18* (2006.01)

(52) U.S. Cl.
CPC ..... *H03K 19/018521* (2013.01); *H01L 24/16* (2013.01); *H01L 24/17* (2013.01); *H01L 25/18* (2013.01); *H03K 3/037* (2013.01); *H01L 24/13* (2013.01); *H01L 2224/131* (2013.01); *H01L 2224/16227* (2013.01); *H01L 2224/1703* (2013.01); *H01L 2224/17051* (2013.01); *H01L 2224/17181* (2013.01); *H01L 2924/1431* (2013.01); *H01L 2924/1432* (2013.01); *H01L 2924/1433* (2013.01); *H01L 2924/1434* (2013.01); *H01L 2924/15192* (2013.01); *H01L 2924/15311* (2013.01)

(58) Field of Classification Search
CPC ......... H03K 19/018521; H03K 17/063; H03K 3/012; H03K 17/567; H03K 17/687; H03K 17/102; H03K 17/14; H03K 21/08; H03K 4/94; H03K 5/00
USPC .......................... 327/108, 109, 110, 111, 112
See application file for complete search history.

(56) References Cited

U.S. PATENT DOCUMENTS

| 5,208,492 A | 5/1993 | Masumoto et al. |
| 5,808,480 A | 9/1998 | Morris |
| 6,300,802 B1 | 10/2001 | Smetana |

(Continued)

OTHER PUBLICATIONS

Kwak et al., "5 Gbit/s 2-tap low-swing voltage-mode transmitter with least segmented voltage-mode equalisation", Electronic Letters, Sep. 11, 2014, pp. 1371-1373, vol. 50, No. 19.

(Continued)

*Primary Examiner* — John W Poos
(74) *Attorney, Agent, or Firm* — Treyz Law Group, P.C.; Jason Tsai (57) ABSTRACT

A multichip package may include a transmitter die and a receiver mounted on a substrate. The transmitter die may be coupled to the receiver die through die-to-die connections such as microbumps and conductive paths in the substrate. The transmitter die may include flexible transmitter circuitry having transceiver logic and driver circuitry. The driver circuitry may include a high-swing driver and a low-swing driver optionally equalization circuitry. The driver circuitry may operable in a high-swing mode, a low-swing mode with equalization, and a low-swing mode without equalization. Transmitter circuitry provided in this way removes undesirable DC voltage paths to ground present in other driving schemes to reduce power consumption while still meeting bandwidth, flexibility, and scalability demands.

20 Claims, 10 Drawing Sheets

(56) References Cited

U.S. PATENT DOCUMENTS

| | | |
|---|---|---|
| 6,885,226 B2 | 4/2005 | Waldrop |
| 6,975,135 B1 | 12/2005 | Bui |
| 7,205,786 B2 | 4/2007 | Ahmad |
| 7,215,148 B1 | 5/2007 | Johnson et al. |
| 7,262,634 B2 | 8/2007 | Lane et al. |
| 7,417,454 B1 | 8/2008 | Rahman et al. |
| 8,410,818 B1 * | 4/2013 | Hsu ................ H03K 19/0013 326/27 |
| 8,461,880 B2 | 6/2013 | Tran |
| 9,755,644 B2 * | 9/2017 | Yamada ............. H03K 19/20 |
| 2013/0120020 A1 | 5/2013 | Li et al. |
| 2014/0184280 A1 * | 7/2014 | Wright ........... H03K 19/00369 327/110 |

OTHER PUBLICATIONS

Dehlaghi et al.. "A 0.3 pJ/bit 20 Gb/s/Wire Parallel Interface for Die-to-Die Communication", Journal, Nov. 2016, pp. 2690-2701, vol. 51, No. 11.

* cited by examiner

FLEXIBLE TRANSMITTER CIRCUITRY FOR INTEGRATED CIRCUITS

BACKGROUND

This relates generally to integrated circuits and more particularly, to integrated circuit packages with more than one integrated circuit die.

An integrated circuit package typically includes an integrated circuit (IC) die and a substrate on which the die is mounted. The integrated circuit die is coupled to the substrate through bonding wires or solder bumps. Signals from the integrated circuit die travels through the bonding wires or solder bumps to the substrate.

As demands on integrated circuit technology continue to outstrip even the gains afforded by ever decreasing device dimensions, an increasing number of applications demand a packaged solution with more integration than is possible in a single silicon die. In an effort to meet this need, more than one IC die can be placed within an integrated circuit package (i.e., a multichip package).

However, as more dies are communicatively connected to each other in the integrated circuit package, communications between the dies becomes increasingly important and a limiting factor to device performance. In particular, it may be crucial to incorporate different types of dies from different technology nodes to cater to different types of applications in a single integrated circuit package. This must all be done while meeting communications requirements between the different types of dies and accounting for reliability requirements, power requirements, space requirements, cost requirements, etc. for communications circuitry.

Accordingly, to obtain better performance and increase flexibility of communications circuitry for a wide variety of chip technologies, an integrated circuit die having improved communications circuitry such as improved transmitter circuitry is needed.

It is within this context that the embodiments described herein arise.

DETAILED DESCRIPTION

The present embodiments relate to integrated circuits and more particularly, integrated circuits with flexible transmitter circuitry operable in multiple modes of operation to cater to varying needs of different applications. In particular, the flexible transmitter circuitry may include driver circuitry having a high-swing driver, a low-swing driver, and optionally equalization circuitry in the low-swing driver.

Given that integrated circuit packages may include a wide range of integrated circuits with varying functions and formed using various technology nodes, the flexible transmitter circuitry can reliably meet the communication demands between these integrated circuits. The transmitter circuitry may also operate in different modes of operations optimized for different types of application to further provide flexible yet targeted solution for die-to-die connectivity.

It will be recognized by one skilled in the art, that the present exemplary embodiments may be practiced without some or all of these specific details. In other instances, well-known operations have not been described in detail in order not to unnecessarily obscure the present embodiments.

Figure 1:
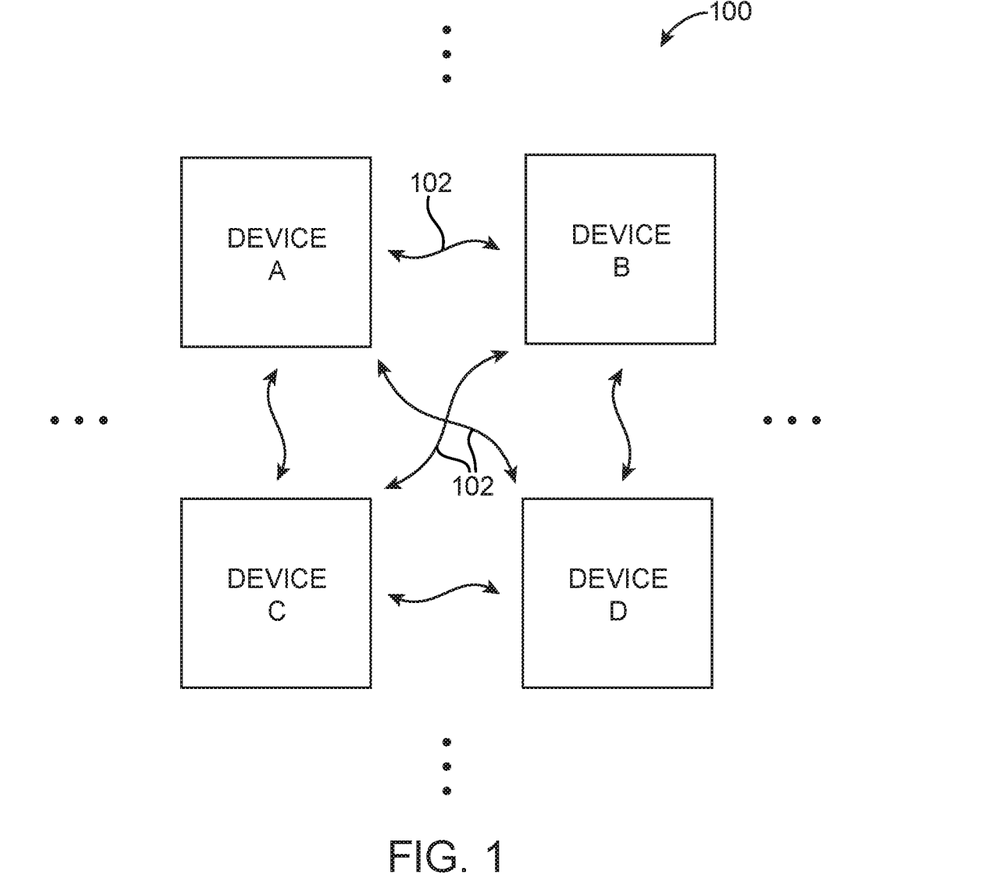
FIG. 1 is a diagram of an illustrative system of integrated circuit devices operable to communicate with one another in accordance with some embodiments.

FIG. 1 is a diagram of an illustrative system 100 of interconnected electronic devices. The system of interconnected electronic devices may have multiple electronic devices such as device A, device B, device C, device D, and interconnection resources 102. Interconnection resources 102 such as conductive lines and busses, optical interconnect infrastructure, or wired and wireless networks with optional intermediate switching circuitry may be used to send signals from one electronic device to another electronic device or to broadcast information from one electronic device to multiple other electronic devices. For example, a transmitter in device B may transmit data signals to a receiver in device C. Similarly, device C may use a transmitter to transmit data to a receiver in device B.

The electronic devices may be any suitable type of electronic device that communicates with other electronic devices. Examples of such electronic devices include integrated circuits having electronic components and circuits such as analog circuits, digital circuits, mixed-signal circuits, circuits formed within a single package, circuits housed within different packages, circuits that are interconnected on a printed-circuit board (PCB), etc.

As integrated circuit fabrication technology scales towards smaller process nodes, it becomes increasingly challenging to design an entire system on a single integrated circuit die (sometimes referred to as a system-on-chip). Designing analog and digital circuitry to support desired performance levels while minimizing leakage and power consumption can be extremely time consuming and costly.

One alternative to single-die packages is an arrangement in which multiple dies are placed within one package. Such types of packages that contain multiple interconnected dies may sometimes be referred to as systems-in-package (SiPs), multichip modules (MCM), or multichip packages. Placing multiple dies (e.g., chips) within a single package may allow each die to be implemented using the most appropriate technology node, may increase the performance of die-to-die interface (e.g., driving signals from one die to another within a single package is substantially easier than driving signals from one package to another, thereby reducing power consumption of associated input-output buffers), may free up input-output pins (e.g., input-output pins associated with die-to-die connections are much smaller than pins associated with package-to-board connections), and may help simplify printed circuit board (PCB) design (i.e., the design of the PCB on which the multi-chip package is mounted during normal system operation).

Figure 2:
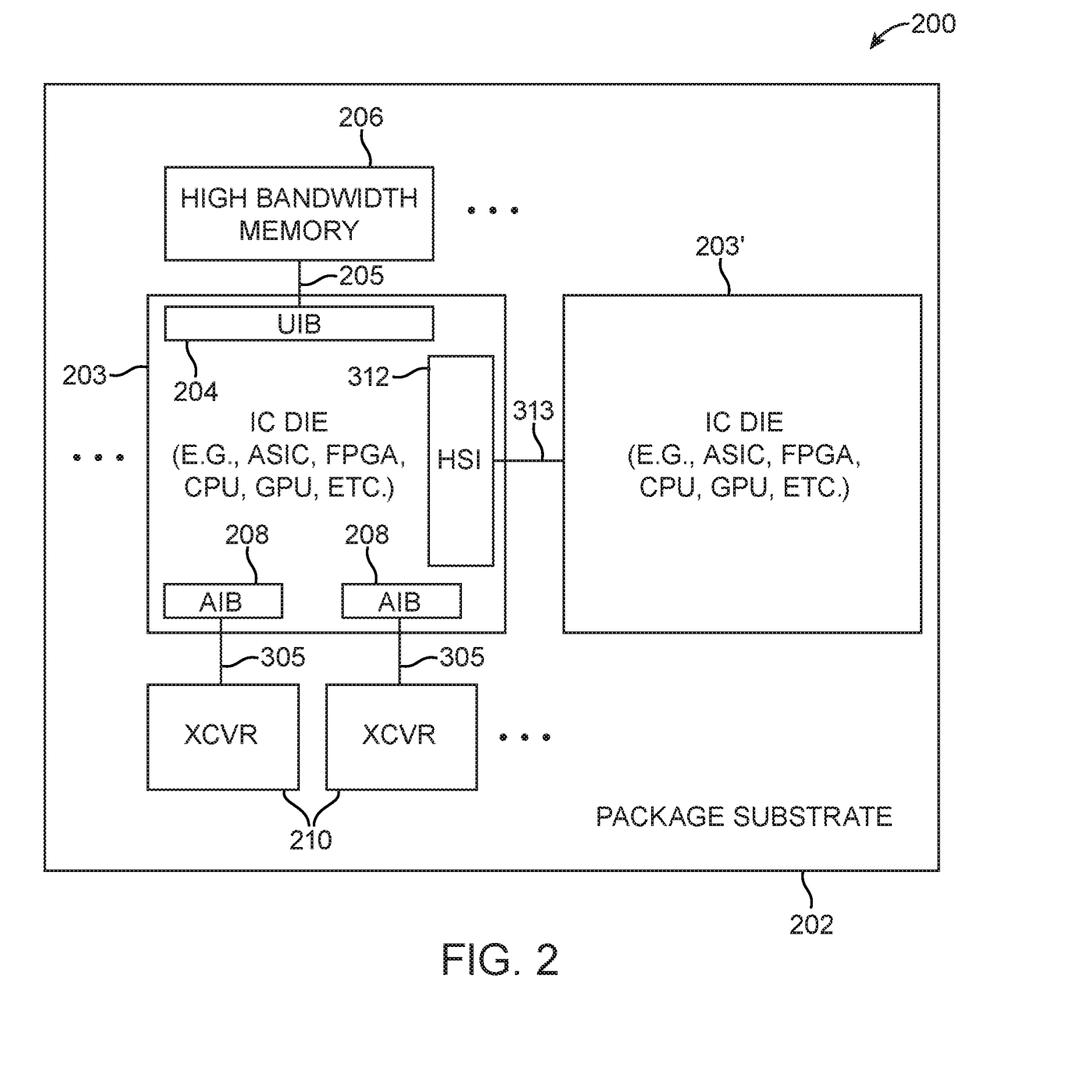
FIG. 2 is a top layout view of a multichip package that includes an integrated circuit die communicatively coupled with other dies using various interface blocks in accordance with some embodiments.

FIG. 2 is a diagram of an illustrative multichip package 200. As shown in FIG. 2, multichip package 200 may include one or more integrated circuit dies such as an integrated circuit (IC) die 203, an integrated circuit die 203', transceiver (XCVR) dies 210, and high bandwidth memory (HBM) die 206 mounted on a common package substrate 202. Substrate 202 may be a passive silicon substrate, an active silicon substrate (e.g., a substrate that includes transistors for assisting operations on a main die such as die 203 or die 203'), or any interposer substrate carriers. This arrangement in which multiple dies are mounted on a common package substrate may sometimes be referred to as a "2.5D" arrangement.

IC dies 203 and 203' may, for example, each be a programmable integrated circuit such a field-programmable gate array (FPGA) device, an application-specific integrated circuit (ASIC) device, or any other type of device based on any type of technology. IC dies 203 and 203' may, as another example, each be a central processing unit (CPU), a graphic processing unit (GPU), or any other type of general- or specific-function processor. IC dies 203 and 203' may be formed from different technologies, may be integrated circuits of different types, and/or may be processors having different functions. Alternatively, if desired, IC dies 203 and 203' may be formed from the same technology, be integrated circuits of the same type, and/or be processors having the same function.

IC die 203 may include on-package interconnect circuitry such as the Advanced Interface Blocks (AIBs) 208 for communicating with transceiver dies 210 via bus 305. Bus 305 is sometimes referred to as an interface bus. Bus 305 may be an Advanced Interface Bus or an ALTERA Interface Bus, as examples. Transceiver dies 210 may be configured to transmit and receive signals to and from components external to package 200 and to support high-speed data communications (e.g., at data rates of more than 10 Gbps, more than 50 Gbps, or more than 100 Gbps, etc.) over 1-16 lanes with the off-package components (as an example). The example of FIG. 2 in which AIBs 208 for interfacing with transceiver dies 210 are formed along the bottom peripheral edge (shoreline) of die 203 is merely illustrative. In general, AIBs 208 may be formed on portion of die 203. The examples of the AIBs and the Advanced Interface Bus are merely illustrative. If desired, any suitable type of communications interface and any suitable type of bus may be used instead or in addition to AIBs 208 and bus 305.

IC die 203 may also include on-package interconnect circuitry such as universal interface block (UIB) 204 for communicating with on-package components such as memory die 206 via bus 205. Bus 205 is therefore sometimes referred to as a universal interface bus. As examples, memory die 206 may be implemented using random-access memory such as static random-access memory (SRAM), dynamic random-access memory (DRAM), low latency DRAM (LLDRAM), reduced latency DRAM (RLDRAM), or other types of volatile memory. If desired, memory die 206 may also be implemented using nonvolatile memory (e.g., fuse-based memory, antifuse-based memory, electrically-programmable read-only memory, etc.). Configured in this way, block 204 may serve as a physical-layer bridging interface between an associated memory controller (e.g., a non-reconfigurable "hard" memory controller or a reconfigurable "soft" memory controller logic) on IC die 203 and one or more high-bandwidth channels that is coupled to an associated memory die 206. In general, universal interface block 204 may be capable of supporting a wide variety of communications protocols, which are not limited to memory interface protocols, for interfacing with different types of daughter dies.

In accordance with some embodiments, UIB 204 may be used to support multiple parallel channel interfaces such as the JEDEC JESD235 High Bandwidth Memory (HBM) DRAM interface or the Quad Data Rate (QDR) wide IO SRAM interface (as examples). In accordance with some embodiments, UIB 204 is able to support external memory interfaces (EMIF) having more than four (DDR) memory channels, four to eight memory channels, eight to 16 memory channels, or more than 16 memory channels. Each of the parallel channels can support single data rate (SDR) or double data rate (DDR) communications.

IC die 203 may further include external input-output (IO) blocks such as a high-speed interface (HSI) block. External IO blocks may support wide parallel interfaces such as EMIF or more generic interfaces like GPIO (general purpose input-output) or LVDS (lower voltage differential signaling) interfaces. External memory interfaces that are supported by external input-output blocks may include double data rate (DDR) interfaces such as DDR type-3 (DDR3), low power DDR3 (LPDDR3), DDR type-4 (DDR4), low power DDR4 (LPDDR4), DDR type-5 (DDR5), graphics DDRx, quad data rate (QDR), Open NAND Flash Interface (ONFI), or other suitable interfaces for communicating with memory that is external to package 200.

In accordance with an embodiment, external input-output (IO) blocks may include an HSI block 312 that supports communications with other dies within package 200 (e.g., IC die 203'). As shown in FIG. 2, a communications bus such as communications bus 313 may couple HSI block 312 in IC die 203 to IC die 203'. In this illustrative example, external IO block 312 may support GPIO, LVDS, or other suitable interfaces to communicate with IC die 203'.

If desired, IC die 203 may include any suitable additional circuitry other than the interfacial circuitry shown in the example of FIG. 2. If desired, package 200 may include any suitable number of additional dies not shown in FIG. 2, each having a suitable number of interconnects with dies in package 200.

Figure 3:
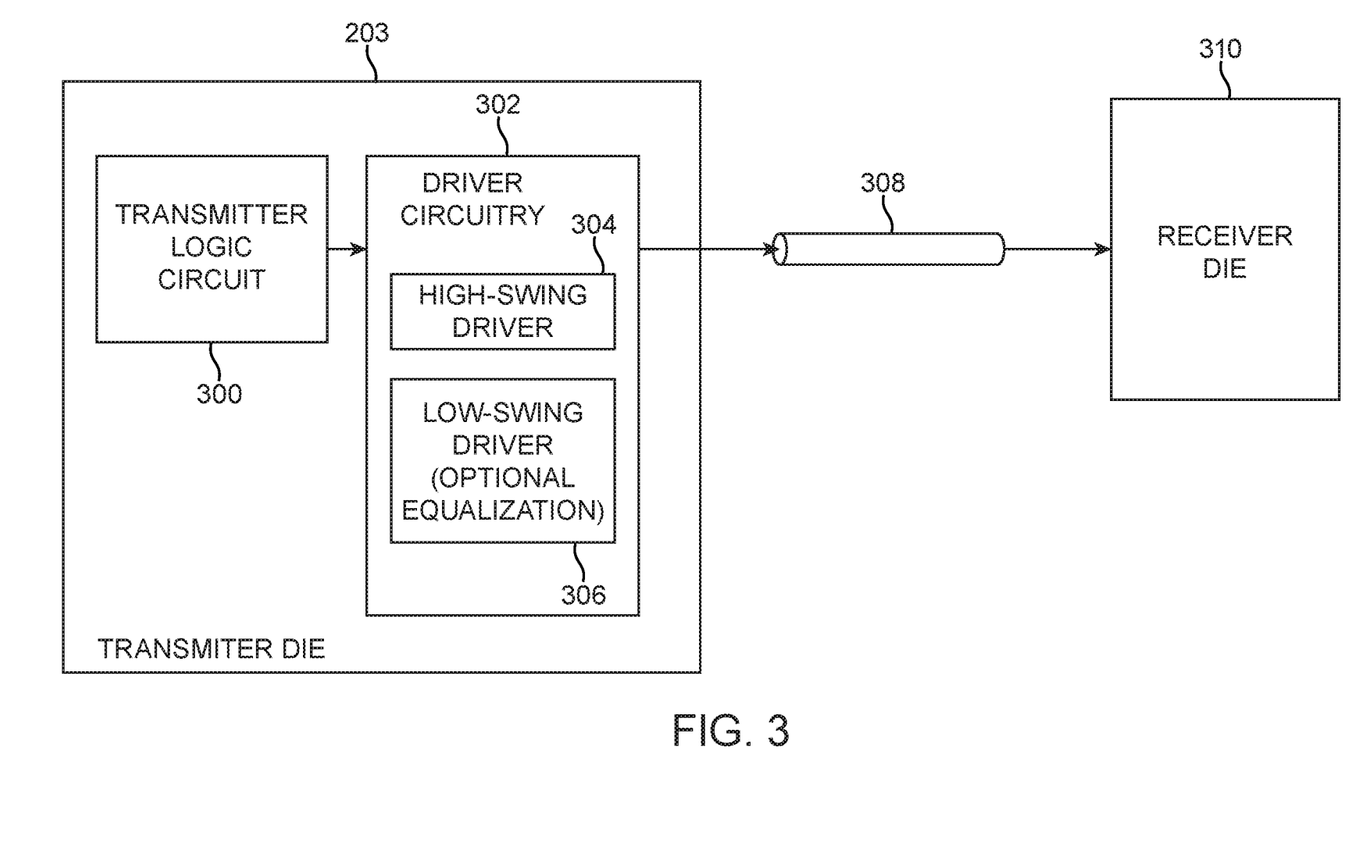
FIG. 3 is a diagram of an illustrative system having transmitter circuitry in an integrated circuit die that includes a high-swing driver and a low-swing driver with optional equalization in accordance with some embodiments.

FIG. 3 shows an illustrative example where IC die 203 serving as a signal transmitting die (sometimes referred to as a transmitter die) may be connected with IC die 310 serving as a signal receiving die (sometimes referred to as a receiver die). As an example, receiver die 310 may be IC die 203' in package 200 as shown in FIG. 2 (e.g., may be an ASIC device, a FPGA device, a CPU, a GPU, etc. inside the same package as IC die 203). As other examples, receiver die 310 may be one of transceiver dies 210 or high bandwidth memory die 206. If desired, however, receive die 310 may be any other die within package 200. Receiver die 310 may include any suitable circuits configured to properly receive data signal (e.g., sent by transmitter die 203). As examples, receiver die 310 may include transceiver circuitry or receiver circuitry having driver circuits, control logic circuits, etc.

To facilitate efficient and flexible communications between dies within a package such as IC dies 203 and 310, IC die 203 may include flexible communications or transmitter circuitry (implemented in transceiver circuitry if desired). The transmitter circuitry may be utilized for transmitting signals out of IC die 203 through channel 308 into IC die 310. Channel 308 may be formed from conductive traces, wires, copper cables, flip-chip bumps, solder bumps, microbumps, or any other connective structures. If desired, channel 308 may be implemented on multiple parallel communicative paths that are referred to as a channel 308.

Transmitter circuitry in IC die 203 may include transmitter logic circuit 300 (sometimes referred to as transmitter logic) and driver circuitry 302 (sometimes referred to herein as data transmission driver circuitry). Driver circuitry 302 may include a first output driver or driver circuit such as a high-swing driver (e.g., high-swing driver 304) and a second output driver or driver circuit such as low-swing driver (e.g., driver circuit 306). Output driver 304 may be referred to as a 'high-swing' driver because driver 304 may generate an output signal for driver circuitry 302 that has high voltage swings (e.g., a voltage swing of 0 V to 1.2 V, 0 V to 1 V, 0 V to 0.8 V, 0 V to 0.6 V, 0 V to 0.5 V, 0 V to 0.4 V, 0 V to 0.3 V, or any other suitable voltage swing). Output driver 306 may be referred to as a 'low-swing' driver because driver 306 may generate an output signal for driver circuitry 302 that has low voltage swings (e.g., a voltage swing of 0 V to 0.6 V, 0 V to 0.5 V, 0 V to 0.4 V, 0 V to 0.3 V, 0 V to 0.2 V, 0 V to 0.1 V, or any other suitable voltage swing). In some embodiments, the output signal voltage swing for output driver 304 may be larger in magnitude than the output signal voltage swing for output driver 306.

If desired, the respective operations of high-swing driver 304 and low-swing driver 306 may be mutually exclusive. In other words, when high-swing driver 304 is activated or enabled, low-swing driver 306 is deactivated or disabled (e.g., place in a tri-state mode) and vice versa. Driver circuitry 302 when using high-swing driver 304 (e.g., an activated high-swing driver 304) may generate an output signal having a voltage swing that is larger than that of an output signal generated when using low-swing driver 302 (e.g., an activated low-swing driver 306). As a specific example, the voltage swing of the output signal generated by an activated high-swing driver 304 may be 0.8 V, while the voltage swing of the output signal generated by an activated low-swing driver 306 may be 0.4 V. This is merely illustrative, if desired, any suitable voltage swing may be implemented for the respective output signals for high-swing driver 304 and low-swing driver 306.

Additionally, driver circuitry 302 may include equalization circuitry (sometimes referred to as a pre-emphasis circuit) within low-swing driver 305. Equalization circuitry may reduce or cancel frequency-dependent attenuations imparted to the signal by transmission channel 308. Equalization circuitry may be used to provide high-frequency and direct signal level boosting to compensate for high-frequency signal loss (e.g., losses in copper-based channels that exhibit undesired low-pass transfer characteristics that result in signal degradation at high data rates) or to enhance signal-to-noise ratio (SNR) in scenarios in which uncorrelated noise such as crosstalk is present. As examples, equalization circuitry may implement linear equalization schemes such as finite impulse response (FIR) and feed forward equalization (FFE) schemes or nonlinear adaptive equalization schemes such as infinite impulse response (IIR) or decision feedback equalization (DFE) schemes.

By providing high-swing driver 304, low-swing driver 306 and equalization circuitry in the transmitter circuitry of IC die 203, IC die 203 may flexibly change the operating mode of the transmitter circuitry to adapt to the properties of transmitter die 203 and receiver die 310. As such, the transmitter circuitry in FIG. 3 may be implemented in one or more of blocks 204, 208, 312 in IC die 203 in FIG. 2, if desired. If desired, the transmitter circuitry described in FIG. 3 may be implemented in interface blocks of any of dies 203', 206, and/or 210 in FIG. 2.

Figure 4:
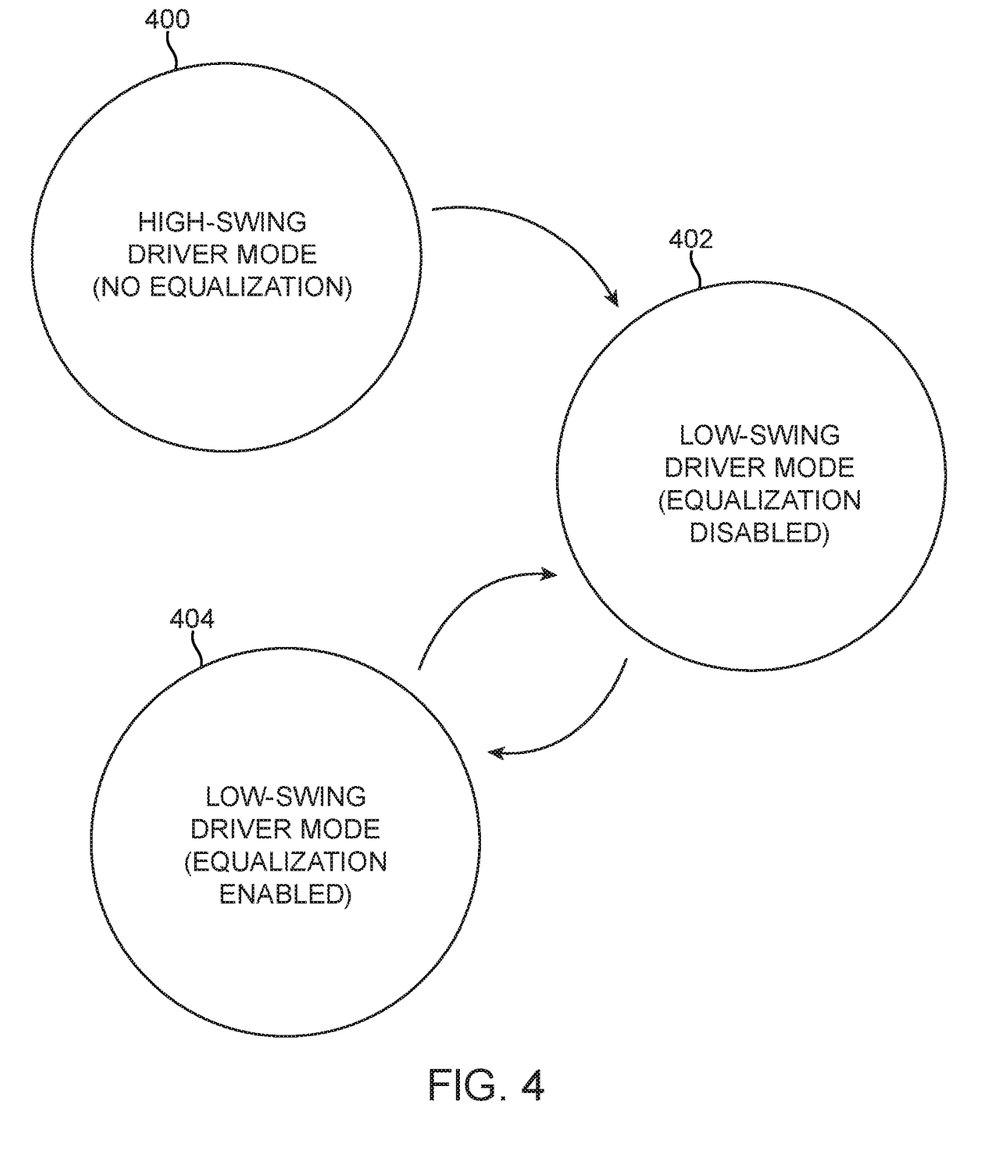
FIG. 4 is a diagram of illustrative modes of operation for transmitter circuitry of the type shown in FIG. 3 in accordance with some embodiments.

FIG. 4 shows illustrative modes of operation for transmitter circuitry of the type shown in IC die 203 in FIG. 3. In particular, driver circuitry 302 in FIG. 3 may operate in a first mode of operation such as high-swing driver mode 400 (sometimes referred to as high-swing mode) by enabling a high-swing driver portion such as high-swing driver 304 in FIG. 3 and disabling a low-swing driver portion such as placing low-swing driver 306 in FIG. 3 in a tri-state mode. The driver circuitry may operate in high-swing driver mode 400 without equalization (e.g., by disabling equalization circuitry described in FIG. 3). If desired, the driver circuitry may operate in high-swing driver mode 400 for lower speed applications such as some AIB applications (e.g., utilizing speeds of 2 Gbps) or other applications utilizing speeds of 2 Gbps or lower. If desired, the driver circuitry may operate in high-swing driver mode 400 for cost-sensitive applications.

Driver circuitry 302 in FIG. 3 may also operate in a second mode of operation such as low-swing driver mode 402 with equalization disabled (sometimes referred to as low-swing mode 402 without equalization). In this low-swing driver mode 402, the high-swing driver portion may be disabled (e.g., high-swing driver 304 in FIG. 3 may be placed in a tri-state mode), the low-swing driver portion (e.g., low-swing driver 306 in FIG. 3) may be enabled, and the equalization circuitry in low-swing driver 306 in FIG. 3 may be disabled. If desired, the driver circuitry may operate in low-swing driver mode 402 without equalization for lower speed applications having very strict power requirements (e.g., for low power applications, or applications with limited power supply potential, etc.) as equalization circuitry may consume excess power.

Driver circuitry 302 in FIG. 3 may also operate in a third mode of operation such as low-swing driver mode 404 with equalization enabled (sometimes referred to as low-swing mode with equalization). In this low-swing driver mode 404, the high swing driver portion may be disabled (e.g., high-swing driver 304 in FIG. 3 may be placed in a tri-state mode), the low-swing driver portion (e.g., low swing driver 306 in FIG. 3) may be enabled, and the equalization circuitry may be enabled. If desired, the driver circuitry may operate in low-swing driver mode 404 with equalization for high-speed applications and the equalization circuitry may compensate channel losses. As an example, low-swing driver 306 with equalization circuitry may compensate for channel losses up to 6 dB and may be suitable for applications having data rates of up to 10 Gbps or higher.

The modes of operation and illustrative applications shown and described in connection with FIG. 4 are merely illustrative. If desired, the driver flexible driver circuitry of the type in FIG. 3 may be operated in other suitable manners. If desired, the modes of operation described in FIG. 4 and other modes of operation may be used in any suitable application (not limited to those applications described in connection with FIG. 4).

Figure 5A:
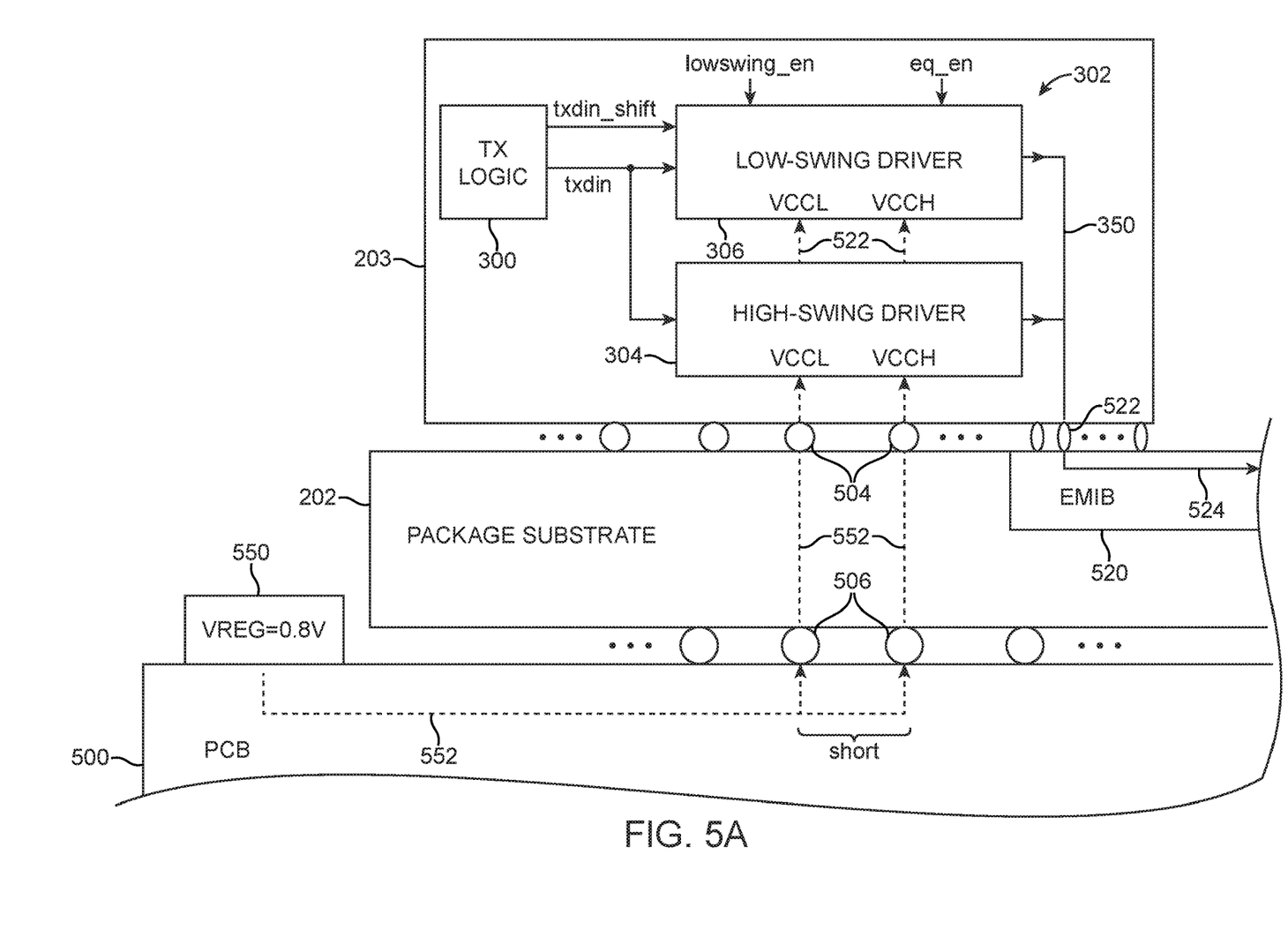
FIG. 5A is a cross-sectional side view of an illustrative multichip package of the type shown in FIG. 2 that includes transmitter circuitry operated in a high-swing driver mode of operation in accordance with some embodiments.
Figure 5B:
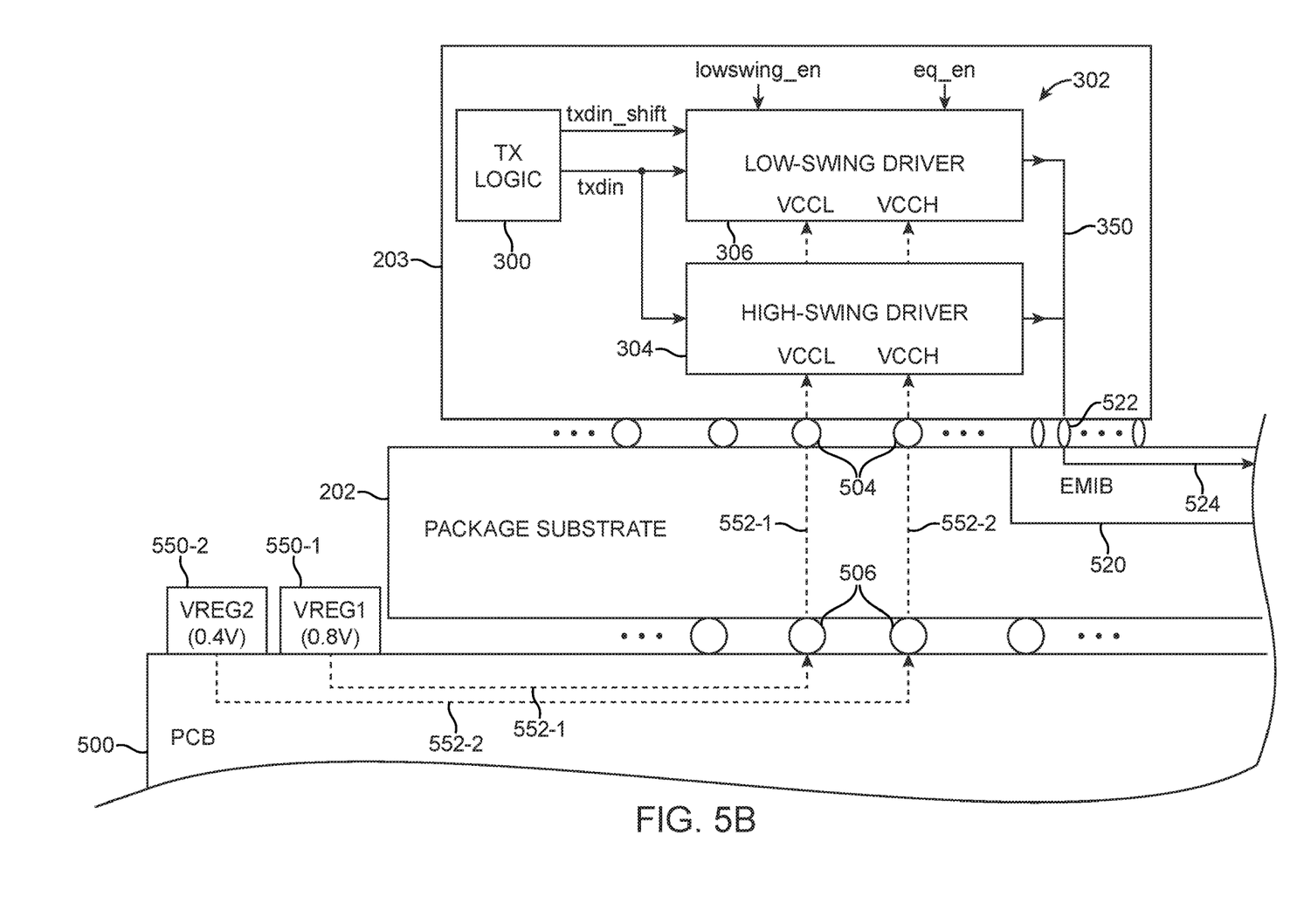
FIG. 5B is a cross-sectional side view of an illustrative multichip package of the type shown in FIG. 2 that includes transmitter circuitry operated in a low-swing driver mode of operation in accordance with some embodiments.

FIGS. 5A and 5B show block diagrams in cross-sectional side views of multichip package 200 of the type described in connection with FIG. 2. As shown in FIG. 5A, package 200 may include package (semiconductor) substrate 202 (or optionally an interposer) and IC die 203 mounted on substrate 202. Package 200 may also include other dies. As examples, other dies in package 200 described in connection with FIG. 2 may also be mounted on substrate 202, or may be mounted on IC die 203 or on another package substrate.

Flip-chip (otherwise known as controlled collapse chip connection or "C4") bumps 504 may be formed between substrate 202 and die 203, and between substrate 202 and other various dies mounted on substrate 202. An array of solder balls 506 (sometimes referred to collectively as a ball grid array or "BGA") may be formed at the bottom surface of package substrate 202. Multichip package 200 formed in this way may then be mounted on a printed circuit board (PCB) such as PCB 500 in FIG. 5A to communicate with other devices in a larger system.

As described in connection with FIG. 3 and shown in FIG. 5A, IC die 203 may include transmitter logic 300, high-swing driver 304, and low-swing driver 306. Transmitter logic 300 may provide data signal txdin to high-swing driver 304 and low-swing driver 206 for transmission. Transmitter logic 300 may also provide a shifted version of data signal txdin (i.e., data signal txdin_shift) to low-swing driver 306. As an example, data signal txdin_shift may be a one clock cycle delayed version of data signal txdin.

Low-swing driver 306 may receive control signal low-swing_en that controls whether low-swing driver 306 is enabled or in a tri-state mode (e.g., disabled). Low-swing driver 306 may receive control signal eq_en that controls whether equalization or pre-emphasis circuitry is enabled or disabled. If desired, high-swing driver 304 may similarly receive a control signal indicating whether high-swing driver 304 is enabled or in a tri-state mode (e.g., disabled). In some embodiments (e.g., in which the operations of low-swing driver 306 and high-swing driver 304 are mutually exclusive), high-swing driver 304 may also receive control signal lowswing_en or a modified version of control signal lowswing_en. In other words, control signal lowswing_en may be able to control the states (e.g., enabled or disabled states) of both high-swing driver 304 and low-swing driver 306.

High-swing driver 304 and low-swing driver 306 may generate (e.g., drive) driver output signals off driver output path 350 in IC die 203. The output signals may be provided through microbump 522 onto conductive paths in package substrate 202. As an example, the conductive paths in package substrate 202 may be dedicated (ultra) high-density interconnections between dies within package 200. These dedicated high-density interconnections may be an Embedded Multi-Die Interconnect Bridge (EMIB) silicon chip 520 that is embedded in package substrate 202. EMIB 520 may generally include short wires such as wires 524, which help to significantly reduce loading at output drivers and directly boost performance. The mesh of short wires 524 within EMIB 520 may be coupled to smaller solder bumps such as microbumps 522, which exhibits reduced pitch and therefore offers denser interconnectivity relative to flip-chip bumps 504. Wires 524 on EMIB 520 may provide the output signals from driver circuitry 203 on transmitter die 203 to a receiver die in package 200 (e.g., receiver die 310 in FIG. 3).

FIG. 5A, in particular, shows flexible transmitter circuitry on IC die 203 when operating in a high-swing driver mode of operation (e.g., mode 400 in FIG. 4). In the high-swing driver mode of operation, high-swing driver 304 may be activated and low-swing driver 306 may be placed in a tri-state mode (e.g., deactivated). Additionally, while driver circuitry 302 (e.g., high-swing driver 304 and low-swing driver 306) may sometimes receive two different supply voltages VCCL and VCCH, conductive paths 522 supplying supply voltages VCCL and VCCH may be electrically shorted to each other to provide a single supply voltage level to driver circuitry 302 when operating in high-swing driver mode of operation. As an example, a voltage regulator such voltage regulator 550 on PCB 500 may supply the single supply voltage level to high-swing driver 304 in driver circuitry 302 through conductive traces on PCB 500, solder bumps 506, conductive traces 552 on package substrate 202, bumps 504, and conductive traces 552 on IC die 203. If desired, conductive paths 522 may be shorted at PCB 500 to ensure that a single supply voltage level is provided to high-swing driver 304.

In some embodiments, the single supply voltage level may be at 0.8 V, and as such, the high voltage level of output signal on path 350 may be at 0.8 V. This is merely illustrative. If desired, any other suitable voltage level may be used. As an example, the single supply voltage level may be the same as a core supply voltage level for a main die in package 200.

Referring to FIG. 5B, the configurations of IC 203, package substrate 202, and PCB 500 in FIG. 5B are similar to those described in connection with FIG. 5A. Similar features already described in connection with FIG. 5A are not described further in connection with FIG. 5B in order to not unnecessary obscure the details of FIG. 5B. FIG. 5B, in particular, shows flexible transmitter circuitry on IC die 203 when operating in a low-swing driver mode of operation (e.g., mode 402 or mode 404 in FIG. 4). In the low-swing driver mode of operation, low-swing driver 306 may be activated and high-swing driver 304 may be placed in a tri-state mode (e.g., deactivated). Low-swing driver 306 may receive two different supply voltages such as first supply voltage VCCL and second supply voltage VCCH. Separate voltage regulator circuits on PCB 500 may provide supply voltages VCCL and VCCH to low-swing driver 306 in driver circuitry 302. As an example, voltage regulator 550-1 may provide supply voltage VCCL through conductive traces 552-1, solder bumps 506, and bumps 504 to low-swing driver 306. As another example, voltage regulator 550-2 may provide supply voltage VCCH through conductive traces 552-2, solder bumps 506, and bumps 504 to low-swing driver 306.

In some embodiments, supply voltage VCCL may be at 0.8 V and supply voltage VCCH may be at 0.4 V. This is merely illustrative. If desired, any other suitable voltage levels may be used. As an example, supply voltage VCCL may use a core supply voltage level for a main die in package 200 and supply voltage VCCH may be dedicated voltage level used exclusively in IC blocks in package dies. As another example, voltage regulator 550-2 and supply voltage VCCL may be omitted if low-swing driver 306 does not include equalization circuitry.

The examples in FIGS. 5A and 5B are merely illustrative. If desired, additional dies and interconnections may be formed in package 200. If desired, driver circuitry 302 may receive additional suitable control signals to operate high-swing driver 304, low-swing driver 306, and/or equalization circuitry.

Figure 6A:
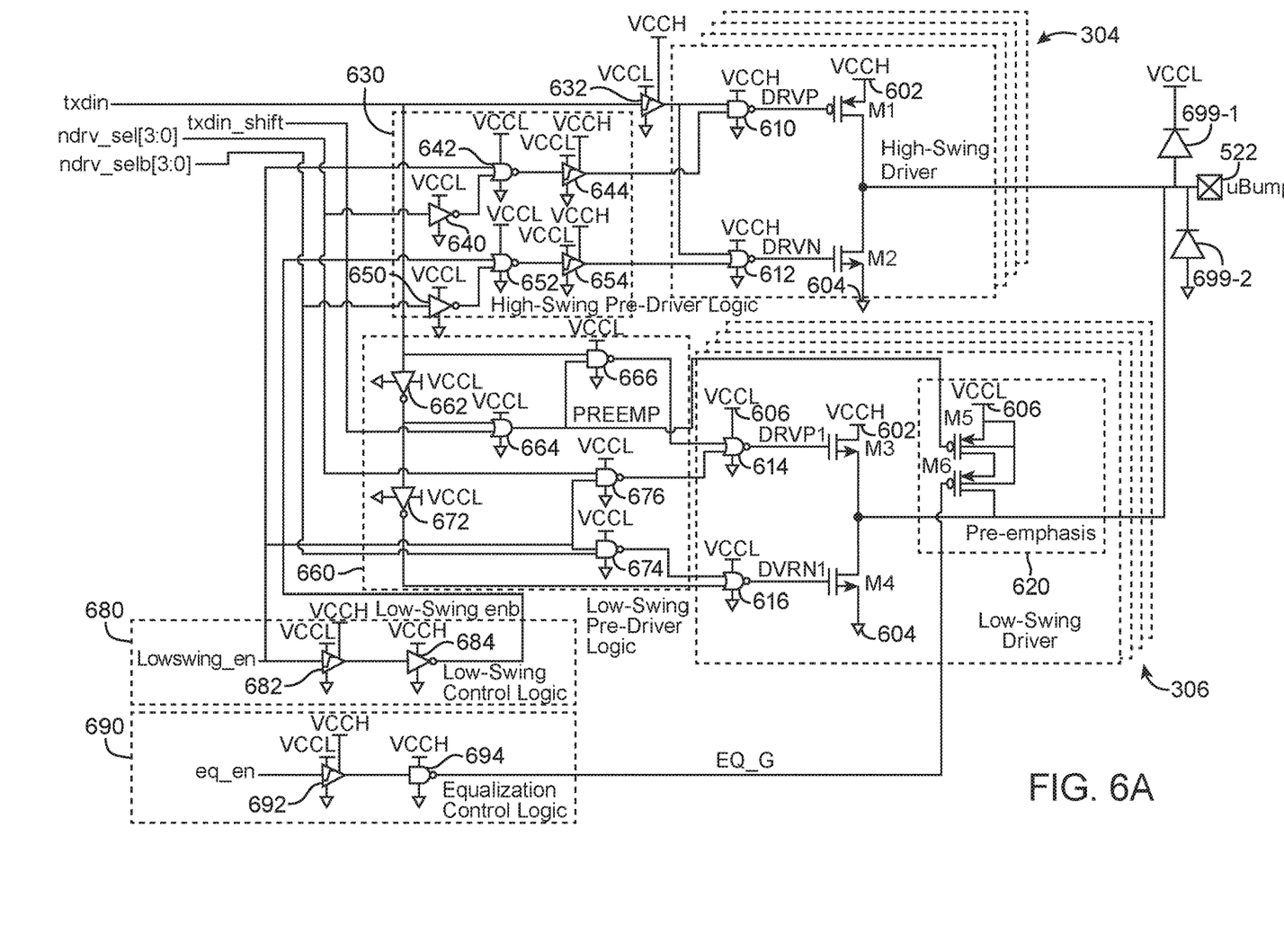
FIG. 6A is a schematic diagram of flexible transmitter circuitry that includes control logic, pre-driver logic, and driver circuitry in accordance with some embodiments.

FIG. 6A shows a schematic circuitry diagram of transceiver logic 300 and driver circuitry 302 of the type described in connection with FIGS. 3, 5A, and 5B. Driver circuitry 302 may include high-swing driver 304, low-swing driver 306, and pre-emphasis circuit 620 (sometimes referred to as equalization circuitry) within low-swing driver 306. Transceiver logic 300 may include first pre-driver logic such as high-swing pre-driver logic circuit 630, second pre-driver logic such as low-swing pre-driver logic circuitry 660, driver control logic such as low-swing control logic circuit 680, and equalization control logic such as equalization control logic circuit 690.

High-swing driver 304 may include a pull-up transistor (PMOS) transistor M1 having a first source-drain terminal (e.g., a source terminal) coupled to voltage supply (rail) 602 providing supply voltage VCCH. Transistor M1 may have a second source-drain terminal (e.g., a drain terminal) coupled to a first source-drain terminal (e.g., drain terminal) of a pull-down transistor such as (NMOS) transistor M2. Transistor M1 may have a gate terminal coupled to an output of NAND logic gate 610 that provides signal DRVP. Transistor M2 may have a second source-drain terminal (e.g., source terminal) coupled to a grounding structure providing a reference voltage (i.e., a grounding voltage) and a gate terminal coupled to an output of NAND logic gate 612 that provides signal DRVN. A driver output may be coupled between transistors M1 and M2 and may be coupled to microbump 522.

Level shifter 632 may receive input data signal for transmission and generate a corresponding (voltage level shifted) output. Since there are two power domains (e.g., voltages VCCL and VCCH), a level shifter may convert the voltage level of an input signal in a first power domain (associated with VCCL) into the voltage level of a second power domain (e.g., associated with voltage VCCH). Level shifter 632 may provide the corresponding output as respective first inputs to NAND logic gates 610 and 612. High-swing pre-driver logic circuit 630 may provide respective second inputs to NAND logic gates 610 and 612. In particular, pre-driver logic circuit 630 may include level shifter 644 that receives an input from NOR logic gate 642 and that generates a corresponding output supplied to NAND logic gate 610 as the second input. Pre-driver logic circuit 630 may similarly include level shifter 654 that receives an input from NAND logic gate 652 and that generates a corresponding output supplied to NAND logic gate 612 as the second input.

Additionally, pre-driver logic circuit 630 may include inverters 640 and 650 that receive control signals pdrv_sel and ndrv_selb, respectively, and that generate corresponding outputs that are supplied as respective inputs to NOR logic gate 642 and NAND logic gate 652. NOR logic gate 642 and NAND logic gate 652 may receive respective additional inputs from low-swing control logic circuit 680. In particular, NOR logic gate 642 may receive control signal lowswing_en as an additional input. NAND logic gate 652 may receive signal lowswing_enb as an additional input. Control signal lowswing_en may be passed through level shifter 682 and inverted by inverter 684 to generate signal lowswing_enb.

Control signals pdrv_sel and ndrv_selb may determine the pull-up strength and pull-down strength of driver circuits (e.g., in high-swing driver 304). If desired, the pull-up and pull-down strengths may be independently controlled by control signals pdrv_sel and ndrv_selb. High-swing driver 304 may include multiple sets of driver circuits (e.g., circuits that include transistors M1 and M2, and logic gates 610 and 612) coupled in parallel to provide the driver output to microbump 522. Different numbers of sets of these parallel driver circuits may be activated as desired to implement suitable driving strength.

Low-swing driver 306 may include a pull-up circuit or transistor such as (NMOS) transistor M3 having a first source-drain terminal (e.g., drain terminal) coupled to voltage supply (rail) 602 providing supply voltage VCCH. Transistor M3 may have a second source-drain terminal (e.g., source terminal) coupled to a first source-drain terminal (e.g., drain terminal) of a pull-down circuit or transistor such as (NMOS) transistor M4. Transistor M3 may have a gate terminal coupled to an output of NOR logic gate 614 that provides signal DRVP1. Transistor M4 may have a second source-drain terminal (e.g., source terminal) coupled to a grounding structure providing a ground voltage and a gate terminal coupled to an output of NOR logic gate 616 that provides signal DRVN1.

Low-swing pre-driver logic circuit 660 may provide inputs to NOR logic gates 614 and 616. In particular, low-swing pre-driver logic circuit 660 may include inverters 662 and 672, OR logic gate 664, and NAND logic gates 666, 674, and 676. Inverter 662 may receive data signal txdin and generate a corresponding output that is provided to OR logic gate 664 as a first input. OR logic gate 664 may receive as a second input a (one clock cycle) shifted version of data signal txdin (e.g., data signal txdin_shift). OR logic gate 664 may generate an output (signal PREEMP) that is received as an input at NAND logic gate 666. NAND logic gate 666 may also receive as an input data signal txdin. NAND logic gate 666 may generate an output. NOR logic gate 614 may receive the output of NAND gate 666 as a first input.

Inverter 672 may receive the output of inverter 662 as an input and generate a corresponding output that is provided to NOR logic gate 616 as an input. NAND logic gates 674 and 676 may receive signal lowswing_en as inputs. Additionally, NAND logic gate 674 may receive signal ndrv_selb as an additional input and generate an output supplied to NOR logic gate 616 as an input. NAND logic gate 676 may receive signal pdrv_sel as an additional input an generate an output supplied to NOR logic gate 614 as an input.

Low-swing driver 306 may include a driver output line (between transistors M3 and M4) coupled to microbump 522. Pre-emphasis circuit 620 may also be coupled to the output line. In particular, pre-emphasis circuit 620 may include a pull-up circuit having two (PMOS) transistors M5 and M6 coupled in series between voltage supply (rail) 606 providing supply voltage VCCL and the driver output line. The gate terminal of transistor M5 may receive signal PREEMP from OR logic gate 664. The gate terminal of transistor M6 may receive signal EQ_G from equalization control logic circuit 690. Control logic circuit 690 may receive control signal eq_en at level shifter 692 and generate a corresponding output that is supplied to NAND logic gate 694 as an input. NAND logic gate 694 may receive the output of level shifter 682 as an additional input and generate signal EQ_G.

Control signals pdrv_sel and ndrv_selb may determine the pull-up strength and pull-down strength of driver circuits (e.g., in low-swing driver 306). If desired, the pull-up and pull-down strengths may be independently controlled by control signals pdrv_sel and ndrv_selb. Low-swing driver 306 may include multiple sets of driver circuits (e.g., circuits that include transistors M3, M4, M5, and M6, and logic gates 614 and 616) coupled in parallel to supply a driver output to microbump 522. Different numbers of sets of these parallel driver circuits may be activated as desired to implement suitable driving strength.

As shown in the illustrative example of FIG. 6A, level shifters in driver circuitry may receive signals in the VCCL domain and shift them to the VCCH domain. Logic gates in pre-driver logic circuits 630 and 660 and low-swing driver 306 may receive voltage VCCL (e.g., operate in the VCCL domain), and logic gates in control logic circuits 680 and 690 and high-swing driver 304 may receive voltage VCCH (e.g., operate in the VCCH domain). In other words, high-swing driver 304 may receive only one positive power supply voltage. Low swing driver 306 may receive two different positive power supply voltages (e.g., pull-up transistor M3 may receive a first positive power supply voltage and pre-emphasis circuit 620 may receive a second positive power supply voltage). If desired, electrostatic discharge (ESD) protection may be implanted using diodes 699-1 and 699-2 for driver output.

Figure 6B:
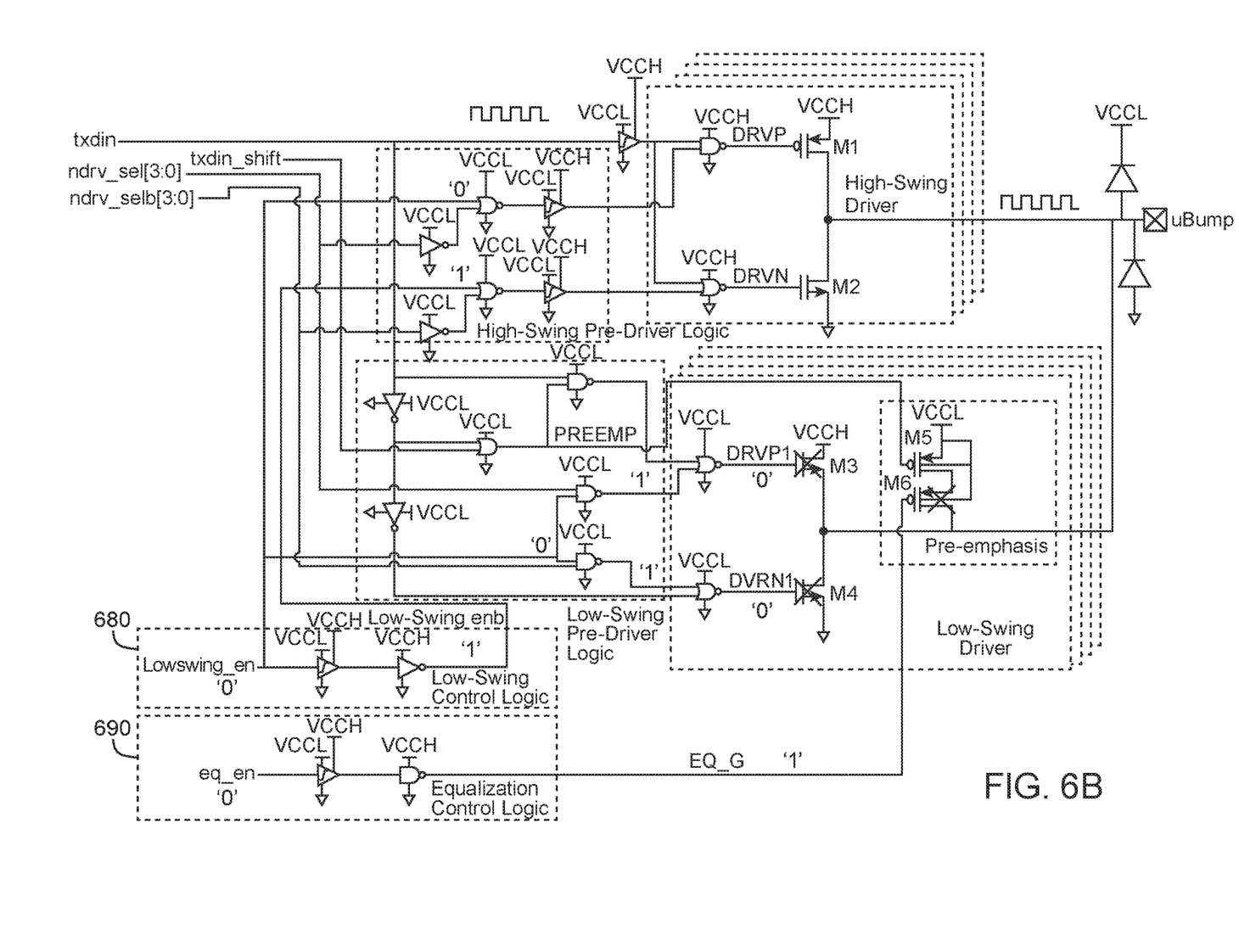
FIG. 6B is a schematic diagram of flexible transmitter circuitry of the type shown in FIG. 6A operating in a high-swing driver mode of operation in accordance with some embodiments.

FIG. 6B shows how transceiver logic 300 and driver circuitry 302 of the type shown in FIG. 6A may be operate in a high-swing driver mode (e.g., mode 400 in FIG. 4). As an example, during the high-swing driver mode, low-swing control logic circuit 680 may receive signal lowswing_en at a logic '0'. Signal lowswing_en at a logic '0' consequently propagate through low-swing pre-driver logic circuit 660 and generates signal DRVP1 at a logic '0' and signal DRVN1 at a logic '0'. Consequently, transistors M3 and M4 are turned off by signals DRVP1 and DRVN1, thereby deactivating low-swing driver 306.

During the high-swing driver mode, equalization control logic circuit 690 may receive signal eq_en at a logic '0' and generate a corresponding output signal EQ_G at a logic '1'. Consequently, transistor M6 in pre-emphasis circuit 620 is turned off by signal EQ_G, and pre-emphasis circuit 620 is deactivated.

Based on the signals lowswing_en and lowswing_enb generated by low-swing control logic circuit 680, high-swing driver 304 is activated. The driver output using high-swing driver 304 is based on input data signal txdin and shorted (common) voltage level VCCH/VCCL.

Figure 6C:
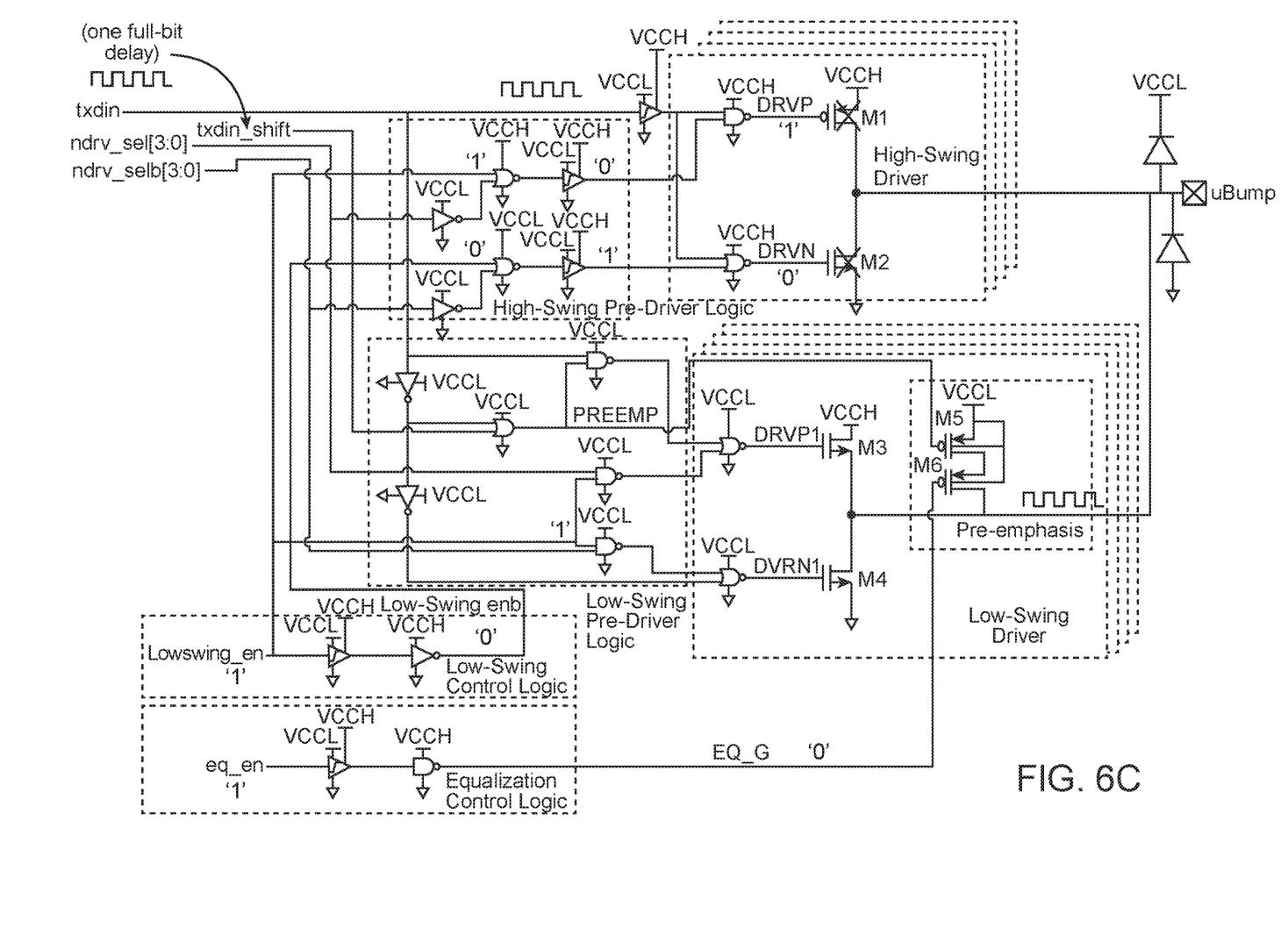
FIG. 6C is a diagram of flexible transmitter circuitry of the type shown in FIG. 6A operating in a low-swing driver mode of operation with equalization in accordance with some embodiments.

FIG. 6C shows how transceiver logic 300 and driver circuitry 302 of the type shown in FIG. 6A may operate in a low-swing driver mode with equalization (e.g., mode 404 in FIG. 4). As an example, during the low-swing driver mode with equalization, low-swing control logic circuit 680 may receive signal lowswing_en at a logic '1'. Low-swing control logic circuit 680 may generate signal lowswing_enb at a logic '0'. Signals lowswing_en and lowswing_enb may propagate through high-swing pre-driver logic circuit 630 and generate signal DRVP at a logic '1' and signal DRVN at a logic '0'. Consequently, transistors M1 and M2 are turned off by signals DRVP and DRVN, thereby deactivating high-swing driver 304.

During the low-swing driver mode with equalization, equalization control logic circuit 690 may receive signal eq_en at a logic '1' and generate a corresponding output signal EQ_G at a logic '0'. Consequently, transistor M6 in pre-emphasis circuit 620 remains turned on by signal EQ_G, and pre-emphasis circuit 620 is activated.

Based on signal lowswing_en, low-swing driver 306 is activated. The driver output using low-swing driver 306 is based on input data txdin and voltage levels VCCH and VCCL. Pre-emphasis circuit 620 may be selective turned on based on pull-up transistor M5 since pull-up transistor M6 remains turned on as long as equalization control logic circuit 690 receives control signal eq_en at a logic '1'.

Figure 7:
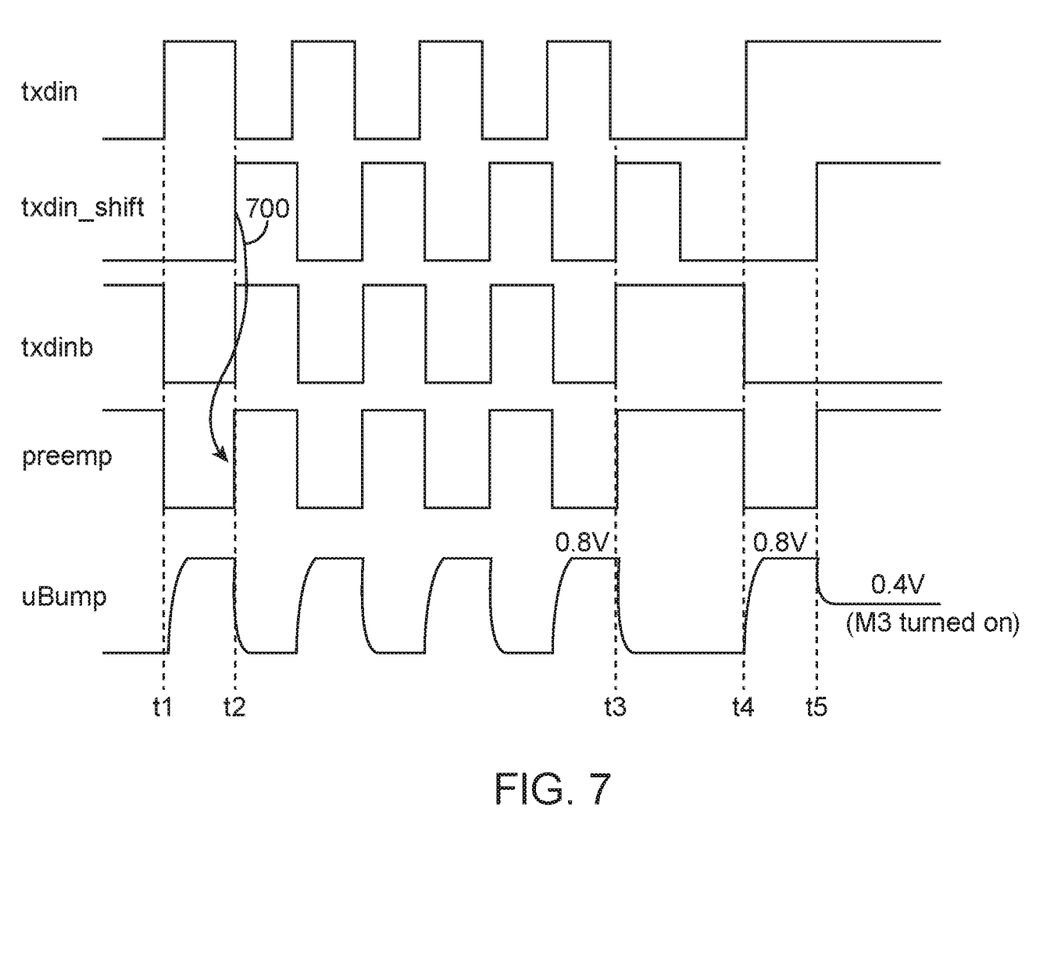
FIG. 7 is a timing diagram for operating driver circuitry that includes equalization circuitry of the type shown in FIG. 6C in accordance with some embodiments.

FIG. 7 shows an illustrative timing diagram for operating pre-driver logic for low-swing driver 306 and low-swing driver 306 with pre-emphasis circuit 620 of the type shown in FIGS. 6A and 6C. As shown in FIG. 7, signal txdin is the original data signal for transmission, signal txdin_shift is a one clock cycle delayed version of signal txdin, and signal txdinb is an inverted version of signal txdin (e.g., after signal txdinb passes through inverter 662 in FIG. 6A). To generate signal PREEMP, signal txdin_shift is OR'ed with signal txdinb (e.g., using OR gate 664 in FIG. 6A).

When signal PREEMP is at a logic '0' to activate (PMOS) transistor M5 (in FIG. 6C), driver output line is pre-emphasized to supply voltage VCCL (e.g., 0.8 V). As an example, at time t1, transistor M5 may be activated (e.g., since signal PREEMP is at a logic '0'). Between time t1 and t2, driver output line coupled to a microbump is pre-emphasized to supply voltage VCCL. At time t2, transistor M5 may be deactivated (e.g., since signal txdin_shift raises signal PREEMP to a logic '1' as indicated by arrow 700) and transistor M4 may be activated. This process may repeat during a high (e.g., maximum) frequency data rate transmission period such as from time t1 to t3.

Beginning at time t3, driver circuitry may operate in a lower frequency data rate transmission period. At time t4, similar to time t1, transistor M5 may be activated to pre-emphasize the driver output line to supply voltage VCCL. At time t4, transistor M5 may be deactivated and, in contrast to time t2, transistor M3 may be activated (e.g., since signals txdin and txdin_shift are both at logic '1's), thereby providing voltage VCCH (e.g., 0.4 V) to the driver output line.

In general, driver circuitry of the type described in connection with FIGS. 3-7 that include a high-swing driver, a low-swing driver, and equalization circuitry provide flexible communications circuitry between different dies. The driver circuitry removes undesirable DC voltage paths to ground present in other driving schemes to reduce power consumption while still meeting bandwidth demands. Additionally, the flexibility of operating the driver circuitry in multiple modes of operations provides increase potential for efficient communications between dies of different technology nodes. As the components of the driver circuitry are digital, this provides good scalability for any future technology nodes.

EXAMPLES

The following examples pertain to further embodiments.

Example 1 is an integrated circuit die, comprising: data transmission driver circuitry having a first output driver and a second output driver that are coupled to a shared output of the integrated circuit die, wherein the first output driver is operable to generate a first output signal having a first voltage swing, and wherein the second output driver is operable to generate a second output signal having a second voltage swing smaller than the first voltage swing.

Example 2 is the integrated circuit die of example 1, wherein the first output driver is optionally disabled if the second output driver is enabled, and wherein the second output driver is optionally disabled if the first output driver is enabled.

Example 3 is the integrated circuit die of any one of examples 1-2, wherein the first output driver optionally uses only one positive power supply voltage.

Example 4 is the integrated circuit die of any one of examples 1-2, wherein the second output driver optionally uses at least first and second different positive power supply voltages.

Example 5 is the integrated circuit die of any one of examples 1-4, wherein the second output driver optionally comprises equalization circuitry configurable in an enabled state and a disabled state.

Example 6 is the integrated circuit die of any one of examples 4-5, wherein the second output driver optionally comprises a first pull-up circuit supplied with the first positive power supply voltage, and wherein the equalization circuitry optionally comprises a second pull-up circuit supplied with the second positive power supply voltage.

Example 7 is the integrated circuit die of example 6, wherein the second pull-up circuit of the equalization circuitry optionally comprises: a first pull-up transistor configured to receive a first control signal; and a second pull-up transistor coupled in series with the first pull-up transistor, wherein the second pull-up transistor is configured to receive a second control signal that is different than the first control signal.

Example 8 is the integrated circuit die of example 7, wherein the first pull-up circuit is optionally controlled based on the first control signal.

Example 9 is the integrated circuit die of any one of examples 7-8, wherein the second output driver is optionally configured to receive a data signal and to transmit the data signal onto the shared output, and wherein the first control signal is optionally generated based on the data signal.

Example 10 is the integrated circuit die of example 9, optionally further comprising: pre-driver logic circuitry configured to receive the data signal and a delayed version of the data signal and to generate the first control signal.

Example 11 is transmitter circuitry, comprising: a pull-up circuit; a pull-down circuit coupled in series with the pull-up circuit; a transmitter output coupled between the pull-up circuit and the pull-down circuit; and a pre-emphasis circuit coupled to the transmitter output, wherein the pre-emphasis circuit is operable to be enabled and disabled and lacks a direct current ground path.

Example 12 is the transmitter circuitry of example 11, wherein the pull-up circuit optionally receives a first positive supply voltage and the pre-emphasis circuit receives a second positive supply voltage that is different than the first positive supply voltage.

Example 13 is the transmitter circuitry of example 12, further optionally comprising: a pre-driver logic circuit coupled to the pull-up circuit, the pull-down circuit, and the pre-emphasis circuit, wherein the pre-driver logic circuit is configured to receive only one positive supply voltage and the one positive supply voltage is the second positive supply voltage.

Example 14 is the transmitter circuitry of any one of examples 11-13, wherein an output data signal on the transmitter output is associated with an input data signal, wherein the pre-emphasis circuit optionally comprises a transistor interposed between a positive voltage supply and the transmitter output, and wherein the transistor is optionally configured to receive a control signal generated based on an inverted version of the input data signal and a delayed version of the input data signal.

Example 15 is the transmitter circuitry of example 14, wherein the pre-emphasis circuit optionally comprises an additional transistor coupled in series with the transistor, wherein the additional transistor is configured to receive an additional control signal indicative of whether the pre-emphasis circuit is in an enabled state.

Example 16 is an integrated circuit package, comprising: a package substrate; a first integrated circuit die mounted on the package substrate; and a second integrated circuit die mounted on the package substrate, wherein the first integrated circuit die comprises: transmitter logic configured to generate data signals; and driver circuitry configured to receive the data signals from the transmitter logic and to output signals to the second integrated circuit die, wherein the output signals are driven to a first positive power supply voltage when a pre-emphasis circuit in the driver circuitry is in an activated state and is driven to a second positive power supply voltage that is different than the first positive power supply voltage when the pre-emphasis circuit is in a deactivated state.

Example 17 is the integrated circuit package of example 16, wherein the first integrated circuit die is optionally coupled to the package substrate by a microbump and wherein the second integrated circuit die is optionally configured to receive the output signals through a die-to-die connection that includes a microbump and a conductive path in the package substrate.

Example 18 is the integrated circuit package of example 17, wherein the conductive path in the package substrate optionally comprises a conductive path in an Embedded Multi-Die Interconnect Bridge (EMIB) chip that is embedded in the package substrate.

Example 19 is the integrated circuit package of any one of examples 16-18, wherein the first integrated circuit die is optionally coupled to the package substrate by first and second bumps and wherein the driver circuitry is optionally configured to receive the first positive power supply voltage through the first bump and to receive the second positive power supply voltage through the second bump.

Example 20 is the integrated circuit package of example 19, wherein the first integrated circuit die optionally further comprises: additional driver circuitry configurable to receive the second positive power supply voltage through the second bump.

For instance, all optional features of the apparatus described above may also be implemented with respect to the method or process described herein. The foregoing is merely illustrative of the principles of this disclosure and various modifications can be made by those skilled in the art. The foregoing embodiments may be implemented individually or in any combination.

What is claimed is:

1. An integrated circuit die, comprising:
data transmission driver circuitry having a first output driver and a second output driver that are coupled to a shared output of the integrated circuit die, wherein the first output driver is operable to generate a first output signal having a first voltage swing, and wherein the second output driver is operable to generate a second output signal having a second voltage swing smaller than the first voltage swing.

2. The integrated circuit die of claim 1, wherein the first output driver is disabled when the second output driver is enabled, and wherein the second output driver is disabled when the first output driver is enabled.

3. The integrated circuit die of claim 1, wherein the first output driver uses only one positive power supply voltage.

4. The integrated circuit die of claim 1, wherein the second output driver uses at least first and second different positive power supply voltages.

5. The integrated circuit die of claim 4, wherein the second output driver comprises equalization circuitry configurable in an enabled state and a disabled state.

6. The integrated circuit die of claim 5, wherein the second output driver further comprises a first pull-up circuit supplied with the first positive power supply voltage, and wherein the equalization circuitry comprises a second pull-up circuit supplied with the second positive power supply voltage.

7. The integrated circuit die of claim 6, wherein the second pull-up circuit of the equalization circuitry comprises:

a first pull-up transistor configured to receive a first control signal; and a second pull-up transistor coupled in series with the first pull-up transistor, wherein the second pull-up transistor is configured to receive a second control signal that is different than the first control signal.

8. The integrated circuit die of claim 7, wherein the first pull-up circuit is controlled based on the first control signal.

9. The integrated circuit die of claim 7, wherein the second output driver is configured to receive a data signal and to transmit the data signal onto the shared output, and wherein the first control signal is generated based on the data signal.

10. The integrated circuit die of claim 9, further comprising:

pre-driver logic circuitry configured to receive the data signal and a delayed version of the data signal and to generate the first control signal.

11. Transmitter circuitry, comprising:

a pull-up circuit;

a pull-down circuit coupled in series with the pull-up circuit;

a transmitter output coupled between the pull-up circuit and the pull-down circuit; and a pre-emphasis circuit coupled to the transmitter output, wherein the pre-emphasis circuit is operable to be enabled and disabled and lacks a direct current ground path.

12. The transmitter circuitry of claim 11, wherein the pull-up circuit receives a first positive supply voltage and the pre-emphasis circuit receives a second positive supply voltage that is different than the first positive supply voltage.

13. The transmitter circuitry of claim 12, further comprising:

a pre-driver logic circuit coupled to the pull-up circuit, the pull-down circuit, and the pre-emphasis circuit, wherein the pre-driver logic circuit is configured to receive only one positive supply voltage that is equal to the second positive supply voltage.

14. The transmitter circuitry of claim 11, wherein an output data signal on the transmitter output is associated with an input data signal, wherein the pre-emphasis circuit comprises a transistor interposed between a positive voltage supply and the transmitter output, and wherein the transistor is configured to receive a control signal generated based on an inverted version of the input data signal and a delayed version of the input data signal.

15. The transmitter circuitry of claim 14, wherein the pre-emphasis circuit comprises an additional transistor coupled in series with the transistor, wherein the additional transistor is configured to receive an additional control signal indicative of whether the pre-emphasis circuit is in an enabled state.

16. An integrated circuit package, comprising:

a package substrate;

a first integrated circuit die mounted on the package substrate; and a second integrated circuit die mounted on the package substrate, wherein the first integrated circuit die comprises:

transmitter logic configured to generate data signals; and driver circuitry configured to receive the data signals from the transmitter logic and to output signals to the second integrated circuit die, wherein the output signals are driven to a first positive power supply voltage when a pre-emphasis circuit in the driver circuitry is in an activated state and is driven to a second positive power supply voltage that is different than the first positive power supply voltage when the pre-emphasis circuit is in a deactivated state.

17. The integrated circuit package of claim 16, wherein the first integrated circuit die is coupled to the package substrate by a microbump and wherein the second integrated circuit die is configured to receive the output signals through a die-to-die connection that includes a microbump and a conductive path in the package substrate.

18. The integrated circuit package of claim 17, wherein the conductive path in the package substrate comprises a conductive path in an Embedded Multi-Die Interconnect Bridge (EMIB) chip that is embedded in the package substrate.

19. The integrated circuit package of claim 16, wherein the first integrated circuit die is coupled to the package substrate by first and second bumps and wherein the driver circuitry is configured to receive the first positive power supply voltage through the first bump and to receive the second positive power supply voltage through the second bump.

20. The integrated circuit package of claim 19, wherein the first integrated circuit die further comprises:

additional driver circuitry configurable to receive the second positive power supply voltage through the second bump.

* * * * *